United States Patent
De Pelsemaeker et al.

(10) Patent No.: US 9,698,332 B2
(45) Date of Patent: Jul. 4, 2017

(54) HYBRID DEVICE COMPRISING A THERMOELECTRIC MODULE, NOTABLY INTENDED TO GENERATE AN ELECTRIC CURRENT IN A MOTOR VEHICLE AND A HEAT EXCHANGER

(71) Applicant: Valeo Systemes Thermiques, Le Mesnil-Saint-Denis (FR)

(72) Inventors: Georges De Pelsemaeker, Poigny-la-Foret (FR); Kamel Azzouz, Paris (FR)

(73) Assignee: VALEO SYSTEMES THERMIQUES, Le Mesnil, Saint Denis (FR)

( * ) Notice: Subject to any disclaimer, the term of this patent is extended or adjusted under 35 U.S.C. 154(b) by 0 days.

(21) Appl. No.: 14/543,335

(22) Filed: Nov. 17, 2014

(65) Prior Publication Data
US 2015/0136193 A1 May 21, 2015

(30) Foreign Application Priority Data

Nov. 18, 2013 (FR) ..................... 13 61255

(51) Int. Cl.
*H01L 35/30* (2006.01)
*H01L 35/32* (2006.01)

(52) U.S. Cl.
CPC .............. *H01L 35/30* (2013.01); *H01L 35/32* (2013.01)

(58) Field of Classification Search
CPC ....... H01L 35/30; H01L 35/32; H01L 35/325; H01L 35/28; H01L 31/024; H01L 31/052;

(Continued)

(56) References Cited

U.S. PATENT DOCUMENTS 3,178,895 A * 4/1965 Mole ....................... F25B 21/02
136/204
9,416,712 B2 * 8/2016 Oesterle .................. F01N 5/025
(Continued)

FOREIGN PATENT DOCUMENTS

| EP | 2541634 A1 | 1/2013 | |
|---|---|---|---|
| FR | 2965402 A1 | 3/2012 | |
| FR | WO 2012041559 A1 * | 4/2012 | ............. H01L 35/30 |

OTHER PUBLICATIONS

English language abstract and machine-assisted English translation for EP 2541634 extracted from espacenet.com database on Jan. 19, 2016, 28 pages.

(Continued)

*Primary Examiner* — Devina Pillay
*Assistant Examiner* — Daniel Malley, Jr.
(74) *Attorney, Agent, or Firm* — Howard & Howard Attorneys PLLC

(57) ABSTRACT

A hybrid device (80) comprises, in a first zone (91), at least one thermoelectric element (3) allowing an electric current to be generated from a temperature gradient applied between two of its active faces (4a, 4p). The device (80) further comprises a first circuit (1) able to allow the circulation of a first fluid, and a second circuit (2) able to allow the circulation of a second fluid of a temperature lower than that of the first fluid so as to create the gradient. The device (80) also comprises a second zone (92) so as to allow an exchange of heat between the second fluid and the first fluid. The device (80) is designed so that the first fluid passes through it by travelling in a single direction, referred to as first direction (L), wherein the first zone (91) and the second zone (92) are situated in series in the first direction (L).

16 Claims, 4 Drawing Sheets

Figure 1:
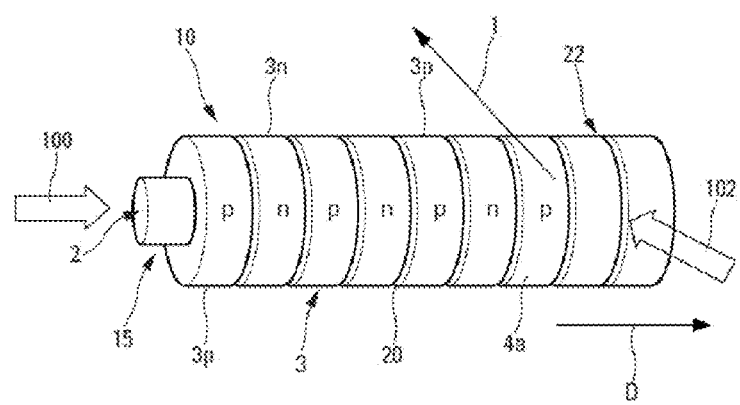

(58) Field of Classification Search
CPC ..... H01L 31/0521; H02S 10/10; H02S 10/40; H02S 10/42; H02S 10/425; F25B 21/02; F25B 41/00; F28D 21/00; F28F 1/00
See application file for complete search history.

(56) References Cited

U.S. PATENT DOCUMENTS

| | | | |
|---|---|---|---|
| 2011/0120106 A1* | 5/2011 | Bruck | F01N 3/2053 60/320 |
| 2012/0324909 A1* | 12/2012 | Brehm | F01N 3/043 62/3.2 |
| 2014/0034105 A1 | 2/2014 | Tondelli et al. | |

OTHER PUBLICATIONS

English language abstract for FR 2965402 extracted from espacenet.com database on Jan. 19, 2016, 4 pages.

* cited by examiner

HYBRID DEVICE COMPRISING A THERMOELECTRIC MODULE, NOTABLY INTENDED TO GENERATE AN ELECTRIC CURRENT IN A MOTOR VEHICLE AND A HEAT EXCHANGER

RELATED APPLICATIONS

This application claims priority to and all the advantages of French Patent Application No. FR 1361255, filed on Nov. 18, 2013.

The present invention relates to a hybrid device comprising a thermoelectric module, notably intended to generate an electric current in a motor vehicle, and to a heat exchanger.

Heat exchangers comprising, in a first zone, elements referred to as thermoelectric elements allowing the generation of an electric current in the presence of a temperature gradient between two of their opposite faces using the phenomenon known as the Seebeck effect have already been proposed. The exchanger is configured to be situated at a front face of the vehicle so that the air stream circulating through a grille of the vehicle can pass through it. The exchanger therefore comprises a stack of fins, one group of which is intended to have the ambient air passing through it, and another group of which is thermally connected to tubes intended for the circulation of a fluid of a vehicle engine coolant loop. The thermoelectric elements are sandwiched between the fins of each group and the tubes so that they are subjected to a temperature gradient arising out of the difference in temperature between the fins.

Such devices may comprise, in a second zone, a part that is not provided with thermoelectric elements so as to allow an exchange of heat between the ambient air and the coolant. The first and the second zone are therefore situated one beside the other so that the ambient air passes through the two zones in parallel.

Such a configuration is ill-suited to exploiting the heat offered by the exhaust gases, particularly recirculated exhaust gases.

The invention seeks to improve the situation and to that end relates to hybrid device comprising, in a first zone, at least one thermoelectric element allowing an electric current to be generated from a temperature gradient applied between two of its active faces, said device comprising a first circuit, referred to as the hot circuit, able to allow the circulation of a first fluid, referred to as hot fluid, and a second circuit, referred to as the cold circuit, able to allow the circulation of a second fluid, referred to as cold fluid, of a temperature lower than that of the hot fluid so as to create said gradient, said hybrid device comprising a second zone so as to allow an exchange of heat between the cold fluid and the hot fluid, said hybrid device being designed so that the hot fluid passes through it by travelling in a single direction, referred to as first direction, said first zone and said second zone being situated in series in the first direction.

Thus, because the first zone is positioned in series with the second zone in the direction in which the hot fluid circulates, it is possible to decorrelate the depth used for the first zone, namely the zone having the thermoelectric elements, and the depth of the second zone, namely the zone devoted to heat exchange. The first zone will moreover be present across the entire lateral surface of the device, namely a surface perpendicular to the first direction, which will allow all of the flow of the hot fluid to be devoted to it. The single direction imparted to the hot fluid also makes it possible to limit pressure drops, which means that said device will be easier to use over a broader engine operating range in the case of an application to exhaust gases.

According to other features of the invention which may be considered together or separately:
- the cold circuit comprises a first part passing through the first zone of the device and a second part passing through the second zone of the device,
- the first zone is situated upstream of the second zone in the first direction;
- the first part of the cold circuit is upstream of the second part of the cold circuit with respect to the circulation of the cold fluid;
- the first zone is thermally and/or electrically insulated from the second zone;
- the hybrid device comprises secondary exchange surfaces for exchange with the hot fluid, which are situated in the first zone and the second zone, the secondary-exchange surfaces situated in the first zone being thermally and/or electrically independent of the secondary-exchange surfaces situated in the second zone;
- the hot circuit and the cold circuit are arranged in such a way that the hot fluid flows transversely to the cold fluid in the hybrid device;
- said thermoelectric element is of annular shape;
- a first of said active faces defined by an external peripheral surface of the thermoelectric element is in a heat-exchange relationship with the hot fluid and a second of said active faces defined by an interior peripheral surface of the thermoelectric element is in a heat-exchange relationship with the cold fluid;
- a first part of the cold circuit passing through the first zone of the device and a second part of the cold circuit passing through the second zone of the device are independent;
- the hybrid device comprises an inlet header for admitting the cold fluid to the first part of the cold circuit, an outlet header for letting the cold fluid out of the first part of the cold circuit, an inlet header for admitting the cold fluid to the second part of the cold circuit and an outlet header for letting the cold fluid out of the second part of the cold circuit, the first part of the cold circuit and/or the second part of the cold circuit comprising several subcircuits for cold fluid to pass between the inlet header and the outlet header of the first part of the cold circuit and/or between the inlet header and the outlet header of the second part of the cold circuit, the subcircuits being parallel to one another;
- the first part of the cold circuit and the second part of the cold circuit comprise the same number of subcircuits;
- the first part of the cold circuit passing through the first zone of the device and a second part of the cold circuit passing through the second zone of the device are intended to be passed through in series, in that order;
- the device comprises an inlet header for admitting the cold fluid to the hybrid device and an outlet header for letting the cold fluid out of the hybrid device, the cold circuit comprising several subcircuits for the passage of the cold fluid in the first zone and in the second zone between the inlet header and the outlet header, the subcircuits being parallel to one another;
- the inlet header for the cold fluid is situated in the region of a module of thermoelectric elements which is intended to come into contact first with said hot fluid, and the outlet header for the cold fluid is situated in the region of a section of the second zone which is intended to come into contact last with said hot fluid;

the inlet header and the outlet header for the cold fluid are situated on one and the same side of the hybrid device;

the thermoelectric elements are grouped together into modules arranged transversely to said first direction;

at least two of said modules form a rank of modules in which rank said modules are spaced apart in the first direction;

at least two of said modules form a row of modules in which row said modules are spaced apart in a second direction, transverse to the first direction;

the cold circuit comprises tubes in said first and/or said second zone of said device, forming a row of tubes in which row at least two of said tubes are spaced apart in the second direction;

the second direction is perpendicular to the first direction and to a direction in which the cold fluid circulates through the hybrid device;

the hybrid device comprises at least two ranks and at least two rows of modules;

two rows of modules are spaced apart in the first direction and two ranks of modules are spaced apart in the second direction;

adjacent modules of two adjacent rows are offset from one another in the second direction so that they are arranged in a staggered configuration;

adjacent modules of two adjacent rows are situated at the same level as one another in the second direction so as to a be arranged in a grid pattern;

adjacent modules of two adjacent ranks are offset from one another in the first direction so as to be arranged in a staggered configuration;

adjacent modules of two adjacent ranks are situated at the same level in the first direction so as to be arranged in a grid pattern;

each of the subcircuits comprises the adjacent modules of each of the rows;

each of the subcircuits successively connects the adjacent rows in a serpentine;

each of the subcircuits comprise pipes connecting the adjacent modules of two different rows together at their ends;

the secondary-exchange surfaces are corrugated and/or perforated and/or louvered fins;

said thermoelectric element has two opposite parallel planar faces connecting their active faces;

the secondary-exchange surfaces have said thermoelectric elements passing through them;

the secondary-exchange surfaces extend in planes parallel to the direction of circulation of the hot fluid;

the secondary-exchange surfaces comprise a catalytic coating in order to perform a catalytic conversion of toxic components of the hot fluid;

said secondary exchange surfaces connect all or some of the modules together so that they have said modules passing through them;

said hybrid device is configured to be positioned in a motor vehicle exhaust gas recirculation pipe so that said secondary-exchange surfaces are swept by said gases, the latter defining said hot fluid.

Figure 2:
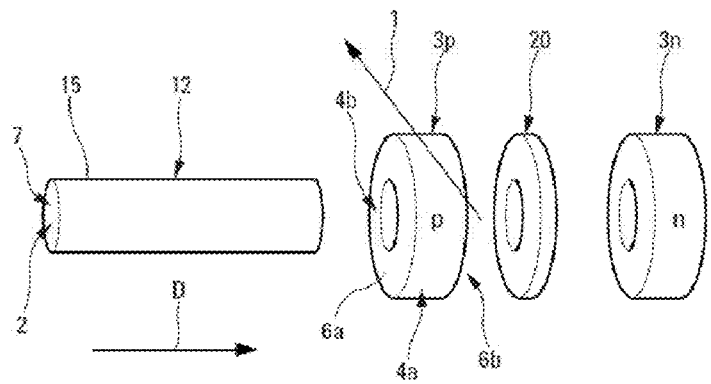
Figure 3:
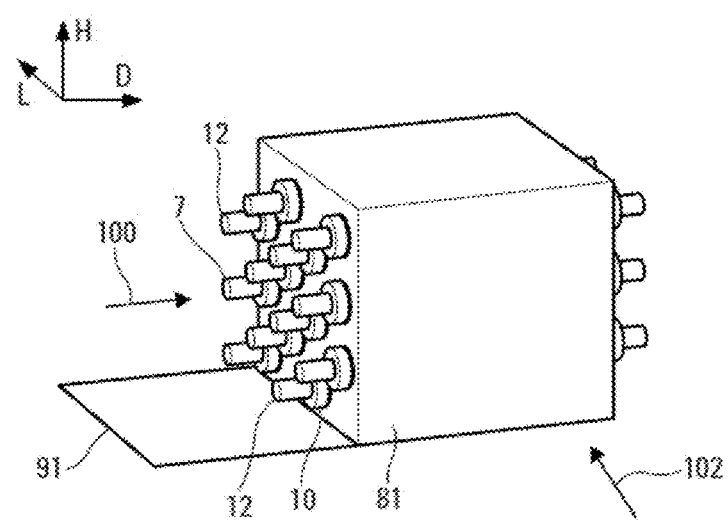
Figure 4:
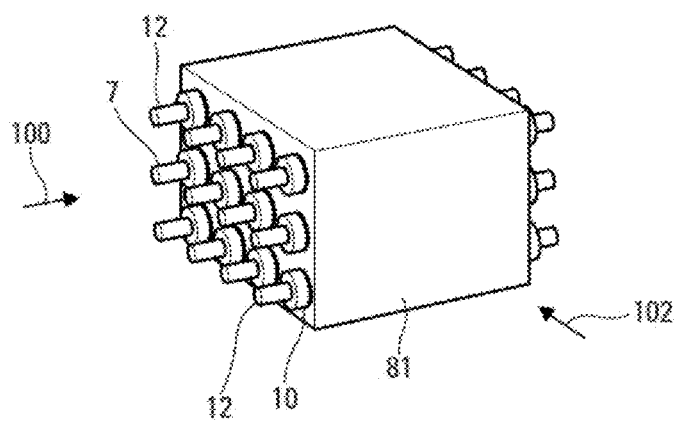
Figure 5:
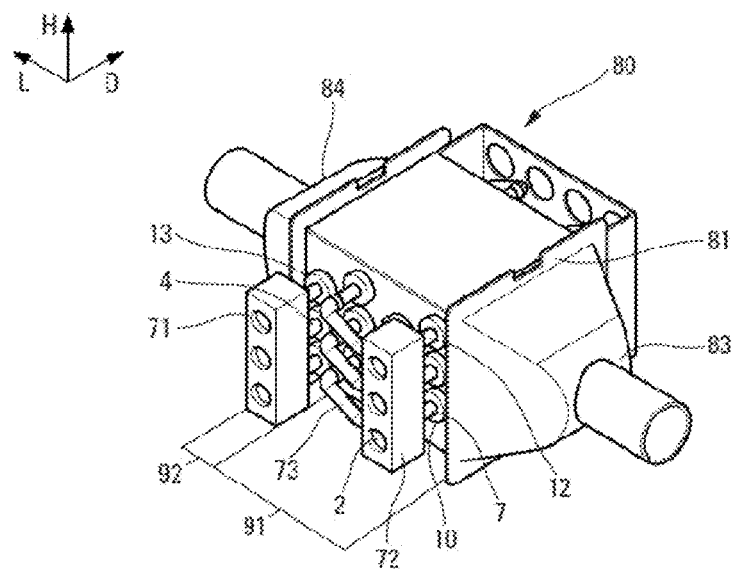
Figure 6:
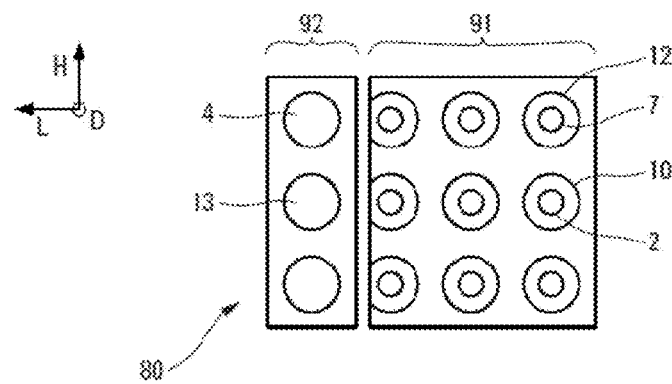
Figure 7:
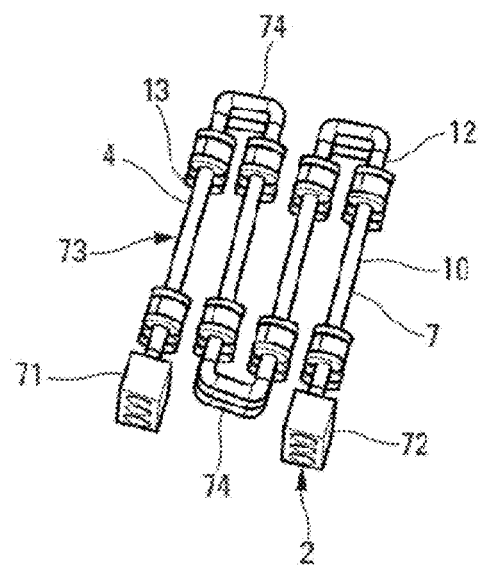
Figure 8:
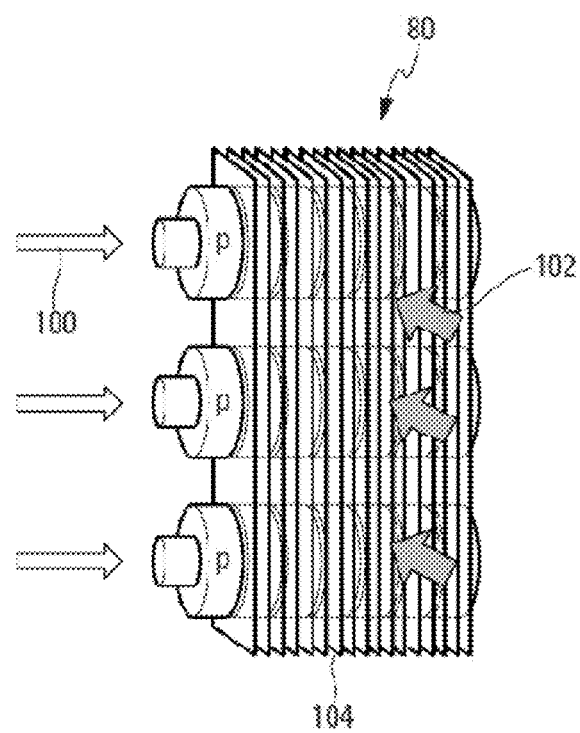

The invention will be better understood in the light of the following description which is given purely by way of indication and is not intended to limit it, which is accompanied by the attached drawings in which:

FIGS. 1 and 2 schematically illustrate, in perspective, steps in the assembly of an example of a module of thermoelectric elements of a hybrid device according to the invention, FIGS. 3 and 4 schematically illustrate, in perspective, exemplary embodiments of an array of a first zone of a hybrid device according to the invention;

FIG. 5 illustrates, in perspective, an example of a hybrid device according to the invention;

FIG. 6 schematically illustrates in cross section a first and a second zone of the hybrid device of FIG. 5;

FIG. 7 schematically illustrates, in perspective, an example of a circuit for the circulation of one of the fluids passing through the hybrid device illustrated in FIG. 5, FIG. 8 schematically illustrates, in perspective, a row of modules of a hybrid device according to the invention.

The invention relates to a hybrid device comprising thermoelectric elements here forming at least one thermoelectric module 10 an example of which is illustrated in FIGS. 1 and 2. Said module 10 here comprises an element of a first circuit 1 referred to as a hot circuit, able to allow the circulation of a first fluid, referred to as the hot fluid, notably exhaust gases from an engine, and an element 15 of a second circuit 2, referred to as the cold circuit, able to allow the circulation of a second fluid, referred to as the cold fluid, notably a heat-transfer fluid of a cooling circuit, of a temperature lower than that of the hot fluid.

Said cold fluid may have a heat transfer coefficient that is higher than said hot fluid, notably by being planned to be a liquid.

The thermoelectric elements are, for example, of annular shape. They are capable of generating an electric current under the action of a temperature gradient applied between two of their faces, one face, 4a, referred to as the first face, being defined by a cylindrical exterior peripheral surface and the other face, 4b, referred to as the second face, being defined by a cylindrical interior peripheral surface. Said first and second faces 4a, 4b are, for example, of circular cross section. More generally, any rounded and/or polygonal cross section is possible. In this instance, the first face 4a is in a heat exchange relationship with the hot circuit and the second face 4b is in a heat-exchange relationship with the cold circuit.

Such elements work on the Seebeck effect and make it possible to create an electric current in a load connected between said faces 4a, 4b subjected to the temperature gradient. In a way known to those skilled in the art, such elements are made, for example, of bismuth and tellurium ($Bi_2Te_3$).

The thermoelectric elements may, in a first part, be elements 3p of a first type, referred to as P, making it possible to establish a difference in electric potential in one direction, referred to as positive, when subjected to a given temperature gradient and, for another part, be elements 3n of a second type referred to as N, allowing the creation of a difference in electric potential in an opposite direction, referred to as negative, when subjected to the same temperature gradient.

In FIGS. 1 and 2, the thermoelectric elements 3 depicted consist of a ring made as a single piece. However, they could be formed of several pieces each forming an angular portion of the ring.

The first surface 4a has, for example, a radius of between 1.5 and 4 times the radius of the second surface 4b. This may be a radius equal to approximately twice that of the second surface 4b.

Said thermoelectric element has, for example, two opposite parallel planar faces 6a, 6b. In other words, the ring that constitutes the thermoelectric element is of rectangular annular cross section.

Said thermoelectric elements 3 are arranged, for example, in the longitudinal continuation of one another, notably coaxially, and the thermoelectric elements of type P alternate with the thermoelectric elements of type N in a direction D referred to as the third direction D. They are notably of identical shape and size. They could, however, have a thickness, namely a dimension between their two planar faces, that differs from one type to the other, notably according to their electrical conductivity.

Said thermoelectric elements 3 are, for example, grouped in pairs, each pair being formed of one said thermoelectric element of type P and of one said thermoelectric element of type N, and said module is configured to allow current to circulate between the first surfaces of the thermoelectric elements of one and the same pair and to allow current to circulate between the second surfaces of each of the thermoelectric elements of said same pair and the adjacent thermoelectric element of the adjacent pair. In that way, electric current is made to circulate in series between the thermoelectric elements 3 positioned one beside the next in the direction D.

To make the fluid circulation circuits 1, 2 easier to configure, provision may be made for said thermoelectric elements 3 to be arranged relative to one another in such a way that their first and/or second surface 4a, 4b lies in the continuation one of the other. Said first and/or said second surfaces 4a, 4b are thus inscribed, for example, in a surface generated by a straight line.

Said element 15 of the cold circuit 2 for the circulation of cold liquid is in contact with said second surface 4b of said thermoelectric elements 3. Said element 15 of the cold circuit 2 is, for example, of circular cross section.

In FIG. 2, it may be seen that said module comprises tubes, referred to as first tubes 12, for the circulation of cold liquid through said cold circuit element. At least two thermoelectric elements of different types are mounted on said first tubes 12. The first tubes 12 are, notably, made of metal. They define at least in part a first part 7 of the cold circuit 2.

Said module 10 may further comprise electrical insulation means 20 positioned between two opposing faces 6a, 6b of thermoelectric elements 3 that are adjacent in the third direction D corresponding to the direction of longitudinal extension of the first tube 12. In FIG. 2, the thermoelectric elements 3, and the electrical insulation means 20 are assembled, alternately, on the first tubes 12 for the circulation of the cold fluid.

Said module may further comprise first electrical-connection means connecting the external peripheral surfaces 4a of two of said thermoelectric elements, which are adjacent, and of different types, and second electrical-connection means connecting the internal peripheral surfaces 4b of two of said thermoelectric elements provided adjacent and of different types.

That being so, in general, as illustrated in FIG. 1, said module is configured in such a way that the hot circuit makes it possible to establish an exchange of heat between said first face 4a and the hot fluid, here circulating around the outside of said thermoelectric elements 3 in the hot circuit 1, in the direction of the arrow illustrated 102 and so that the cold circuit makes it possible to establish an exchange of heat between said second face 4b and the cold fluid, in this instance circulating through the first part 7 of the cold circuit 2 in the direction of the illustrated arrow 100. In the case of thermoelectric elements, the exchange between the thermoelectric elements 3 and the fluid that has the lowest heat exchange coefficient, in this instance the exhaust gases, is thus promoted.

Said module is also configured here in such a way that, at said module, said hot fluid and said second fluid circulate transversely, notably orthogonally, relative to one another as illustrated by the orientation of the arrows 100, 102. Such a configuration encourages the integration of the module into its surroundings while incidentally also reducing the amounts of material involved.

An array of the hybrid device of the invention comprising, in a first zone 91, a plurality of said modules 10 is illustrated in FIGS. 3 and 4. Such a hybrid device comprises at least two of said modules 10 forming a rank of modules and at least two of said modules forming a row of modules.

The modules 10 belonging to same rank of modules are spaced apart in a first direction L and situated at the same level in a second direction H transverse to the first. The modules 10 belonging to the same row of modules are spaced apart in the second direction H and situated at the same level in the first direction L. It may be noted that the device is arranged in such a way that the hot fluid passes through it in just one direction, namely in this instance the first direction L if this is not for going around said modules 10. The first direction L is notably parallel to the direction in which the hot fluid 102 circulates through the hybrid device and the second direction H is perpendicular to the first direction L and to the direction 100 in which the cold fluid circulates through the hybrid device. The modules 10 thus extend in the device in the third direction D and are arranged in ranks in the first direction L and in rows in the second direction H.

The first direction L, the second direction H and/or the third direction D are, for example, mutually perpendicular as illustrated in FIGS. 3 and 4.

In the example illustrated in FIG. 3, the adjacent modules 10 of two adjacent rows are offset from one another in the second direction H in addition to being offset in the first direction L so as to be arranged in a staggered configuration. Modules 10 of two adjacent rows are said to be adjacent when the modules 10 occupy the same position in their respective rows, namely the first modules of the rows starting from the bottom in the second direction H, the modules situated immediately above the first modules, etc.

According to the embodiment of the invention illustrated in FIG. 3, the first zone 91 of the device of the invention comprises four rows of three modules 10 and six ranks of two modules 10. It could of course comprise a different number of rows and/or of ranks and of modules 10 per row and/or of modules 10 per rank.

In the exemplary embodiment illustrated in FIG. 4, the adjacent modules 10 of two adjacent rows are situated at the same level relative to one another in the second direction H so as to be arranged in a grid pattern. The adjacent modules 10 of two adjacent rows are situated at the same level in the first direction L so as to be arranged in a grid pattern. Thus, the number of modules 10 that a row comprises is equal to the number of ranks and the number of modules 10 that a rank comprises is equal to the number of rows. In this example, the first zone 91 of the device comprises four rows of three modules 10 each and three ranks of four modules 10 each but it could of course comprise a different number of rows and/or ranks and of modules 10 per row and/or of modules 10 per rank.

The hybrid device 80 comprises a second zone 92 allowing an exchange of heat between the cold fluid and the hot fluid as illustrated in FIGS. 5 and 6. The device 80 according to the invention thus has a function of generating electricity in its first zone 91 and of exchanging heat in its second zone 92. Said first zone 91 and said second zone 92 are situated in series in the first direction L. In particular, the first zone 91 is situated upstream of the second zone 92 in the direction in which the hot fluid circulates, namely in the first direction L.

It will be observed here that the hot circuit and the cold circuit are arranged in such a way that the hot fluid circulates transversely to the cold fluid in the hybrid device, particularly in said first zone 91.

Said second zone 92 comprises a second part 4 as a cold circuit. In other words, said hot circuit and said second part 4 of said cold circuit are directly in contact so as to allow an exchange of heat between the cold fluid and the hot fluid. The second part of the cold circuit comprises, for example, tubes, referred to as second tubes 13, for the circulation of the cold fluid.

The first zone 91 here comprises several rows of modules 10 and several ranks of modules 10. The second zone 92 here comprises a single row of tubes 13, said second tubes 13 being spaced apart in the second direction H and situated at a face of the device via which the hot fluid leaves the device. The tubes 13 thus form a row of tubes 13 in which row at least two of said tubes 13, in this instance three tubes 13, are spaced apart in the second direction H, preferably with the same spacing as the second tubes 13 of the first zone 91. The second zone 92 here comprises a single row of tubes 13 but could of course comprise a different number of tubes 13.

The hybrid device 80 according to the invention may comprise an inlet header 72 for admitting the cold fluid into the device 80 and an outlet header 71 for letting the cold fluid out of the device, the cold circuit comprising several subcircuits 73 for the passage of the cold fluid through the modules 10 between the inlet header 72 and the outlet header 71, the subcircuits 73 being parallel to one another.

It will be observed here that the first part 7 of the cold circuit and the second part 4 of the cold circuit are connected. In particular, the subcircuits 73 of the first part 7 of the cold circuit and the subcircuits 73 of the second part 4 of the cold circuit communicate with one another in such a way that it is the same fluid that enters the device via the inlet header 72, passes through the first part 7 of the cold circuit, the second part 4 of the cold circuit and re-emerges from the device via the outlet header 71, as visible in FIG. 5.

The outlet header 71 for the cold fluid is here situated in the second zone 91, and the inlet header 72 for the cold fluid is here situated at the row of modules 10 that is intended to come into contact first with said hot fluid, namely the row of modules 10 which is situated closest to the inlet face 81. The inlet header 72 and the outlet header 71 are situated on one and the same side of the device, in this instance a lateral side of the device with respect to the inlet fluid via which the hot fluid enters the device.

Each of the subcircuits 73 comprises the adjacent modules 10 of each of the rows. Thus, there as many independent subcircuits as there are modules 10 per row. Each of the subcircuits 73 here successively connects the adjacent rows in a serpentine. The cold fluid arrives in the inlet header 72, enters one of the modules 10 of the rows situated at the inlet header 72, namely enters the first part 7 of the cold circuit, passes through it in the lengthwise direction in the third direction D as seen earlier, enters an adjacent module 10 of an adjacent row and passes through it in the same direction but in the opposite sense. The cold fluid continues on its way until it reaches the adjacent tube of the row of tubes 13 of the second zone 92, namely until it reaches the second part 4 of the cold circuit which part is situated in the second zone, before leaving the hybrid device via the outlet header 71. It will be appreciated here that the first part 7 of the cold circuit is upstream of the second part 4 of the cold circuit with respect to the circulation of the cold fluid.

According to an alternative form of the invention which is illustrated in FIG. 6, the first part 7 of the cold circuit and the second part 4 of the cold circuit are thermally independent. It will be appreciated here that the device is arranged in such a way as to make the cold fluid circulate in the first zone 91 and in the second zone independently.

The subcircuits of the first part 7 of the cold circuit are therefore independent of the subcircuits of the second part 4 of the cold circuit. Each of these zones will have its own cold fluid inlet header and its own cold fluid outlet header which will be similar to what was described hereinabove. The first part 7 of the cold circuit and the second part 4 of the cold circuit here comprise the same number of subcircuits.

As visible in greater detail in FIG. 7, the subcircuits 73 comprise pipes 74 joining the adjacent modules 10 of two different rows together at their ends. These pipes are notably U-shaped.

The hybrid device according to the invention also comprises an inlet header 83, for admitting the hot fluid into the device, which is situated facing the face via which the hot fluid comes in through the modules 10, and a hot fluid outlet header 84, situated opposite the inlet header 83 that admits the hot fluid to the hybrid device.

As illustrated in FIG. 8, each of the modules may advantageously comprise secondary-exchange surfaces 9, particularly fins 104, for exchange with the hot fluid. In that way, the surface area for exchange between the thermoelectric elements 3 and said hot fluid is increased. Said fins 104 are arranged, for example, transversely, particularly radially with respect to said thermoelectric elements 3. In this instance they are positioned parallel to one another with a spacing that allows a good exchange of heat with the hot fluid but limits pressure drops. Said fins 104 may be off-centered with respect to said thermoelectric elements 3, notably elongate on the side from which the hot fluid arrives. Said fins 104 are, for example, corrugated, perforated and/or louvered. The fact that the fins are corrugated and/or perforated and/or louvered makes it possible to improve the exchange of heat notably by increasing the surface area for exchange and by disturbing the flow of the hot fluid. The fins are notably made of metal.

Said fins 104 advantageously connect the modules together in such a way that said modules pass through them. In these figures, just one of said rows has been illustrated. They may also join the tubes 13 of the second part of the cold circuit together.

From an electrical standpoint, the modules can be connected together in series and/or in parallel, using connections, not depicted, situated at their longitudinal ends.

Said secondary-exchange surfaces 9 may comprise a catalytic coating to perform a catalytic conversion of toxic components of the hot fluid. In the case of exhaust gases, said module may in that way be fitted to a catalytic converter in addition to or in place of components conventionally used for catalysis in such equipment.

According to the embodiment in the figure, the secondary-exchange surfaces of the first zone and that of the second zone are thermally and electrically independent.

As has already been mentioned, such a device may be configured to be positioned in a motor vehicle exhaust gas pipe in such a way that said secondary-exchange surfaces are swept by said gases. In other words, the gases are intended to be ducted between the fins by the exhaust gas pipe itself while the circulation of the second fluid may be achieved by the inlet/outlet headers positioned to the side, making for extreme ease of integration.

The invention claimed is:

1. A hybrid device (80) comprising, in a first zone (91), at least one thermoelectric element (3) allowing an electric current to be generated from a temperature gradient applied between two of its active faces (4a, 4p), the device (80) further comprising a first circuit (1) able to allow the circulation of a first fluid, and a second circuit (2) able to allow the circulation of a second fluid of a temperature lower than that of the first fluid so as to create the gradient, the device (80) further comprising a second zone (92) which is different than the first zone (91) in that the second zone (92) is configured to exchange heat between the first fluid and the second fluid but is not configured to generate an electric current, the device (80) being designed so that the first fluid passes through it by travelling in a first direction (L), wherein the first zone (91) and the second zone (92) are situated in series in the first direction (L), wherein the first circuit (1) and the second circuit (2) are arranged such that the first fluid flows transversely to the second fluid through the entire first zone (91) and the second zone (92); wherein the thermoelectric elements (3) are grouped into rows of modules (10) with at least two adjacent rows of modules (10) being offset relative to one another such that the adjacent rows of modules (10) are staggered and wherein, the first and second zones (91) and (92) are each configured to allow the first and second fluids to flow therethrough.

2. A hybrid device (80) according to claim 1, in which the first zone (91) is situated upstream of the second zone (92) in the first direction (L).

3. A hybrid device (80) according to claim 1, in which the first zone (91) and the second zone (92) are thermally and/or electrically insulated.

4. A hybrid device (80) according to claim 1, further comprising secondary-exchange surfaces (9) for exchange with the first fluid, which are situated in the first zone (91) and the second zone (92), the secondary-exchange surfaces (9) situated in the first zone (91) being thermally and/or electrically independent of the secondary-exchange surfaces (9) situated in the second zone (92).

5. A hybrid device (80) according to claim 1, in which the thermoelectric element (3) is of annular shape, a first of the active faces (4a) defined by an external peripheral surface of the thermoelectric element (3) being in a heat-exchange relationship with the first fluid, and a second of the active faces (4b) defined by an interior peripheral surface of the thermoelectric element (3) being in a heat-exchange relationship with the second fluid.

6. A hybrid device (80) according to claim 1, in which a first part (7) of the second circuit (2) passing through the first zone (91) of the device (80) and a second part (4) of the second circuit (2) passing through the second zone (92) of the device (80) are independent.

7. A hybrid device (80) according to claim 6, comprising an inlet header for admitting the second fluid to the first part (7) of the second circuit (2), an outlet header for letting the second fluid out of the first part (7) of the second circuit (2), an inlet header for admitting the second fluid to the second part (4) of the second circuit (2) and an outlet header for letting the second fluid out of the second part (4) of the second circuit (2), the first part (7) of the second circuit (2) and/or the second part (4) of the second circuit (2) comprising several subcircuits for second fluid to pass between the inlet header and the outlet header of the first part (7) of the second circuit (4) and/or between the inlet header and the outlet header of the second part (4) of the second circuit (2), the subcircuits being parallel to one another.

8. A hybrid device (80) according to claim 7, in which the first part (7) of the second circuit (2) and the second part (4) of the second circuit (2) comprise the same number of subcircuits.

9. A hybrid device (80) according to claim 1, in which the first part (7) of the second circuit (2) passing through the first zone (91) of the device (80) and a second part (4) of the second circuit (2) passing through the second zone (92) of the device (80) are intended to be passed through in series, in that order.

10. A hybrid device (80) according to claim 9, comprising an inlet header (72) for admitting the second fluid to the device (80) and an outlet header (71) for letting the second fluid out of the device (80), the second circuit (2) comprising several subcircuits (73) for the passage of the second fluid in the first zone (91) and in the second zone (92) between the inlet header (72) and the outlet header (71), the subcircuits (73) being parallel to one another.

11. A hybrid device (80) according to claim 10, in which the inlet header (72) for the second fluid is situated in a region of a module (10) of thermoelectric elements which is intended to come into contact first with the first fluid, and the outlet header (71) for the second fluid is situated in a region of a section of the second zone (92) which is intended to come into contact last with the first fluid.

12. A hybrid device (80) according to claim 11, in which the inlet header (72) and the outlet header (71) for the second fluid are situated on one and the same side of the device (80).

13. A hybrid device (80) according to claim 1, in which at least two modules (10) of thermoelectric elements form a row of modules (10) in which row the modules (10) are spaced apart in a second direction (H), transverse to the first direction (L), the second circuit (2) comprising tubes in the region of the first and/or said second zone (91, 92) of the device (80), forming a row of at least two tubes (12, 13) in which the at least two tubes (12, 13) are spaced apart in the second direction (H).

14. A hybrid device (80) according to claim 1, wherein the second zone (92) is free of thermoelectric elements (3).

15. A hybrid device (80) according to claim 1, comprising;
a first tube (12) present in the first zone (91) for circulating the second fluid, with the thermoelectric element (3) mounted on the first tube (12), and
a second tube (13) present in the second zone (92) for circulating the second fluid, with the second tube (13) being in direct contact with the first fluid to exchange heat between the second fluid and the first fluid.

16. A hybrid device (80) according to claim 1, wherein the first zone (91) and the second zone (92) are configured to allow the first fluid to flow through the first zone (91) prior to entering the second zone (92) and configured to allow the second fluid to flow through the first zone (91) prior to entering the second zone (92), such that the configuration results in the temperature gradient of the first and second fluids in the first zone (91) being greater than the temperature gradient of the first and second fluids in the second zone (92).

* * * * *